(12) United States Patent
Knudsen

(10) Patent No.: US 7,443,332 B2
(45) Date of Patent: Oct. 28, 2008

(54) TIME CONTINUOUS PIPELINE ANALOG-TO-DIGITAL CONVERTER

(75) Inventor: Niels Knudsen, Humlebaek (DK)

(73) Assignee: National Instruments Corporation, Austin, TX (US)

(*) Notice: Subject to any disclaimer, the term of this patent is extended or adjusted under 35 U.S.C. 154(b) by 0 days.

(21) Appl. No.: 11/690,952

(22) Filed: Mar. 26, 2007

(65) Prior Publication Data

US 2008/0238754 A1   Oct. 2, 2008

(51) Int. Cl.
*H03M 1/38* (2006.01)
(52) U.S. Cl. .................................... 341/161; 341/155
(58) Field of Classification Search ................. 341/120, 341/122, 155, 161, 172
See application file for complete search history.

(56) References Cited

U.S. PATENT DOCUMENTS

| | | | |
|---|---|---|---|
| 4,733,217 A | 3/1988 | Dingwall | |
| 4,896,155 A | 1/1990 | Craiglow | |
| 4,903,023 A | 2/1990 | Evans et al. | |
| 4,947,168 A | 8/1990 | Myers | |
| 5,070,332 A | 12/1991 | Kaller et al. | |
| 5,248,973 A | 9/1993 | Babu et al. | |
| 5,581,255 A | 12/1996 | Hsu | |
| 5,812,079 A | 9/1998 | Ito et al. | |
| 6,121,912 A | 9/2000 | Brandt | |
| 6,586,747 B1 | 7/2003 | Erdman | |
| 6,653,966 B1 | 11/2003 | van der Goes et al. | |
| 6,784,814 B1 * | 8/2004 | Nair et al. | 341/118 |
| 6,839,009 B1 * | 1/2005 | Ali | 341/118 |
| 6,999,019 B2 | 2/2006 | Cosand | |
| 7,265,704 B1 * | 9/2007 | Shakya | 341/162 |
| 7,280,064 B2 * | 10/2007 | Lin | 341/155 |
| 2004/0155807 A1 | 8/2004 | van der Goes et al. | |

* cited by examiner

*Primary Examiner*—Brian Young
(74) *Attorney, Agent, or Firm*—Meyertons Hood Kivlin Kowert & Goetzel, P.C.; Jeffrey C. Hood

(57) ABSTRACT

A Sampled Pipeline Subranging Converter (SPSC) may include at least one stage—e.g. at least the input stage—operating in a time-continuous fashion. In the time continuous input stage, the analog input may be processed in two parallel paths. A lower path may comprise a track-and-hold (T/H) element, an Analog-to-Digital-Converter (ADC) and a Digital-to-Analog-Converter (DAC). The T/H element may be optional and may be present if required by the ADC. The signal entering the lower path may be sampled at the desired conversion rate. The time continuous stage(s) may additionally be configured with an upper path that includes a delay element configured to receive the analog input, a Low-Pass (LP) filter coupled to the delay element, and an anti alias filter. The output generated by the DAC may be subtracted from the output of the LP filter, and the resulting difference signal may be provided to the anti alias filter, which in turn may generate the residue (or error) output. The digital output of the time continuous converter may be calculated by combining the digital outputs of the various sections.

26 Claims, 1 Drawing Sheet

US 7,443,332 B2

TIME CONTINUOUS PIPELINE ANALOG-TO-DIGITAL CONVERTER

BACKGROUND OF THE INVENTION

1. Field of the Invention

This invention relates generally to analog-to-digital converter (ADC) design and, more particularly, to the design of a time continuous pipeline ADC.

2. Description of the Related Art

Scientists and engineers often use measurement systems to perform a variety of functions, including measurement of a physical phenomena or unit under test (UUT), test and analysis of physical phenomena, process monitoring and control, control of mechanical or electrical machinery, data logging, laboratory research, and analytical chemistry, to name a few examples.

A typical measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a UUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more Digital-to-Analog converters (DACs) in the DAQ device. The DACs may convert the digital signal to an output analog signal that is used, e.g., to stimulate a UUT.

Many DAQ devices require ADCs having a topology that can be used for high-resolution conversion at fast rates (typically from 10 Ms/S [millions of samples per second] and beyond). One such topology is the widely used Sampled Pipeline Subranging Converter (SPSC). The SPSC ADC architecture is predominant in most applications that require sampling rates of greater than 5 Ms/S to 10 Ms/S. The SPSC architecture lends itself to a variety of relatively low cost IC processes—CMOS (complementary metal-oxide semiconductor) and BiCMOS (bi-polar CMOS) being the most popular among them. Current technology generally yields 12- to 16-bit resolution at sampling rates greater than 100 Ms/S.

FIG. 1 shows one example of an SPSC topology 100, as designed by Analog Devices. The pipelined architecture shown in FIG. 1 is a digitally corrected SPSC in which each stage operates on the data for one-half the sampling clock cycle, then passes its residue output to the next stage in the pipeline, prior to the next half clock cycle. The inter-stage track-and-hold (T/H) element (102, 110, etc.) serves as an analog delay line—timing is set such that it enters the hold mode when the first stage conversion is complete. This gives more settling time for the internal SADCs (sub-ADCs) 104 and 112, SDACs (sub-DACs) 106 and 114, and amplifiers, and allows the pipelined converter to operate at a much higher overall sampling rate than a non-pipelined version.

The input to the converter is at T/H 102, the track-and-hold element at the beginning of the pipeline. The track-and-hold is operated at the desired rate for the analog-to-digital conversion. In a conversion cycle the track-and-hold will first sample the signal and then enter into hold mode. In hold mode, SADC 104 converts the track-and-hold output into a digital signal. The digital output is then immediately converted back to analog by SDAC 106. The analog output of SDAC 106 is subtracted from the output of T/H 102. The subtracted output is typically called a residue and represents the error of the first stage of analog-to-digital (A/D) conversion. The error of the first cycle is primarily caused by low resolution of SADC 104 and SDAC 106. The residue is then passed on to the next stage, comprising T/H 110, SADC 112 and SDAC 114, where it is converted in the next conversion clock cycle. In this way the conversion error is reduced in each pipeline stage. The final digital output can be calculated by combining the respective outputs of the various sections, or pipeline stages, with different weighting factors depending on the gains between the different stages.

The achievable resolution is typically limited by the noise performance of the track-and-hold elements. The track-and-hold generally introduces noise by itself. Furthermore, wideband noise beyond half-conversion rate entered into the sample-and-hold is captured by the sample-and-hold and aliased down to base band, (which is the frequency band between DC and half-sampling rate). For example, wideband noise from first stage SDAC 106 would be captured and sampled by second stage T/H 110. In order to minimize noise captured by the track-and-hold (e.g. T/H 110) it would be desirable to limit the bandwidth of the track-and-hold, which would be difficult or even not possible, considering that the required speed of the track-and-hold circuit would lead to the track-and-hold settling between conversion cycles. Hence, it would be desirable to avoid having to use a track-and-hold in each stage and operate the converter in a more efficient mode.

Other corresponding issues related to the prior art will become apparent to one skilled in the art after comparing such prior art with the present invention as described herein.

SUMMARY OF THE INVENTION

In one set of embodiments, a Sampled Pipeline Subranging Converter (SPSC) may include at least one stage—in one set of embodiments at least the input stage—operating in a time-continuous fashion. In the time continuous input stage, the analog input may be processed in two parallel paths. A lower path may comprise a track-and-hold (T/H) element, an Analog-to-Digital-Converter (ADC) and a Digital-to-Analog- Converter (DAC). The T/H element may be optional and may be present if required by the ADC. The signal entering the lower path may be sampled at the desired conversion rate. The DAC may output an analog representation of the analog input signal that may differ from the original input signal in certain ways.

One difference between the analog input signal and the output signal generated by the DAC may result from quantization errors introduced by the ADC. The output signal generated by the DAC may be delayed with respect to the analog input signal, and the sampling process may create high frequency mirrors of the analog input around integer multiples of the sampling frequency, while the amplitude of the output signal generated by the DAC may be attenuated by high frequencies with a Sin(X)/X function, if the DAC is implemented with a zero order hold output.

Differences (between the analog input signal and the output generated by the DAC) attributed in large part to the absence of a track and hold component—and different from differences resulting from quantization errors—may be considered undesirable, as they may result in a residue so large that the next stage in the pipeline might saturate. To minimize and/or eliminate these differences, in one set of embodiments the time continuous stage(s) may be configured with an upper path that includes a delay element configured to receive the analog input, a Low-Pass (LP) filter coupled to the delay element, and an anti alias filter. The output generated by the DAC may be subtracted from the output of the LP filter, and the resulting difference signal may be provided to the anti alias filter, which in turn may generate the residue (or error) output.

The delay block may be configured to delay the analog input signal in order for the output of the DAC and the output of the LP filter entering the difference block (before the anti alias filter) to be delayed equally. By minimizing the delay between the output of the DAC and the output of the LP filter, the amplitude of the difference between the output of the DAC and the output of the LP filter may effectively be minimized. In one set of embodiments, the delay block may be implemented as either a high order passive low pass filter or as a delay line in form of a cable, or a delay line on a printed circuit board (PCB). Those skilled in the art will appreciate that alternate embodiments may feature implementations of the delay element other than those mentioned herein.

The LP filter may be configured to commensurately attenuate higher frequencies with the attenuation that may take place in the DAC. The signal attenuation may follow the functional pattern of Sin(X)/X, where 'X' represents ($\pi*f/f_s$), where 'f' represents the frequency of the input signal and '$f_s$' represents the operating sample frequency of the DAC. In cases where the LP filter cannot be configured to completely match the frequency dependent amplitude attenuation according to the Sin(X)/X function at high frequencies, the DAC may be configured to perform over sampling.

The anti alias filter may be configured to remove high frequency noise components originating from the quantization performed by the ADC, as well as to remove high frequency mirrors of the input signal on the output of the DAC. In addition, bandwidth limitation introduced through the anti alias filter may result in the reduction of high frequency broadband noise that may be characteristic of the operation of the DAC.

As in an SPSC, the digital output of the time continuous converter may be calculated by combining the digital outputs of the various sections. The time-continuous version of an SPSC may be implemented in a variety of ways. Since the dynamic range requirement for the second stage is less stringent than for the first stage, there is greater freedom in how the second stage is implemented. For example, in one set of embodiments, the first stage may be configured to operate in time continuous mode, while the subsequent stages may be configured as standard SPSC stages.

Overall, many variations to the basic architecture described above are possible, and any and all such variations will be apparent to those skilled in the art.

BRIEF DESCRIPTION OF THE DRAWINGS

The foregoing, as well as other objects, features, and advantages of this invention may be more completely understood by reference to the following detailed description when read together with the accompanying drawings in which.

DETAILED DESCRIPTION OF THE PREFERRED EMBODIMENTS

As used herein, "combining signals" includes but is not limited to adding the signals or portions of the signals together, subtracting the signals or portions of the signals from each other, or multiplying the signals or portions of the signals together, or performing any combination thereof.

Figure 1:
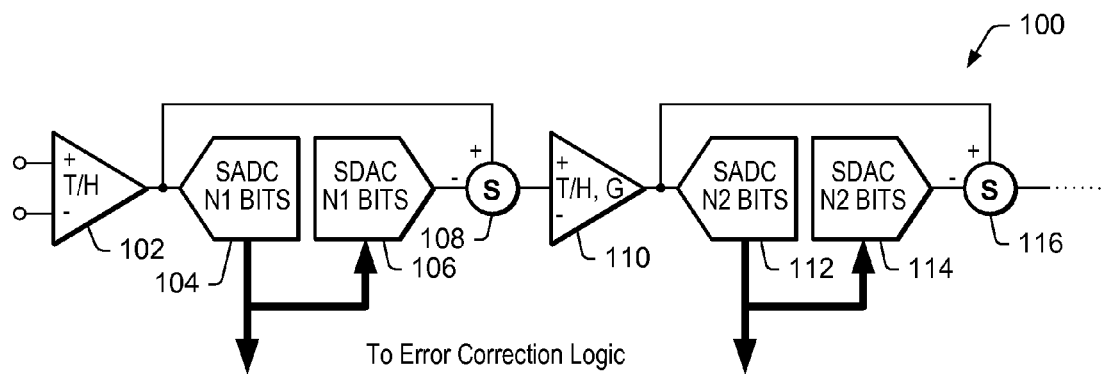
FIG. 1 shows the generalized pipeline stages in a Sampled Pipeline Subranging Converter (SPSC) with error correction, according to prior art.
Figure 2:
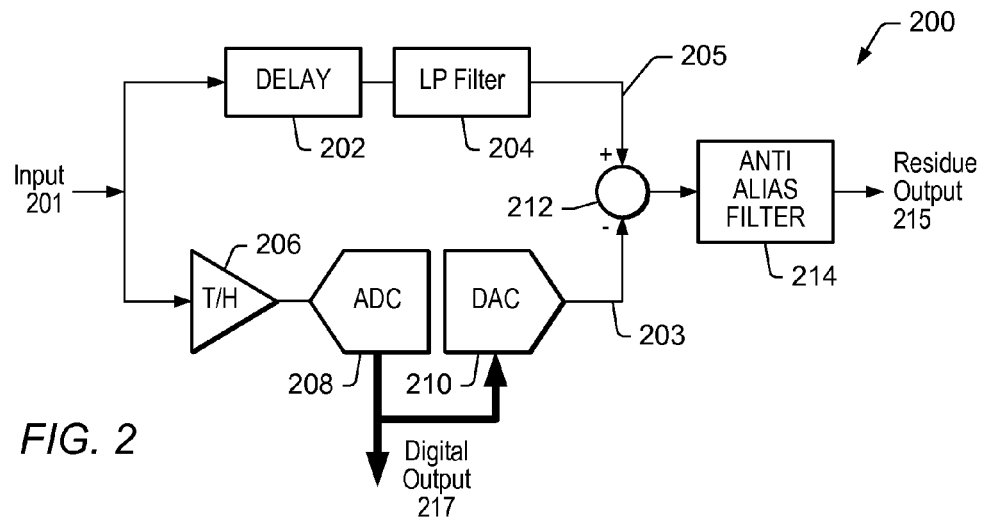
FIG. 2 shows a single stage of a time-continuous implementation equivalent to a single conversion stage in an SPSC, according to one embodiment of the present invention.

FIG. 2 shows a single stage 200 of a time-continuous implementation (i.e. without a track and hold) of a Sampled Pipeline Subranging Converter (SPSC), equivalent to a single conversion stage in the SPSC. The analog input 201 may be processed in two parallel paths. A lower path may comprise a track-and-hold (T/H) element 206, an Analog-to-Digital-Converter (ADC) 208 and a Digital-to-Analog-Converter (DAC) 210. T/H 206 is optional and may be present if required by ADC 208. The lower path may be sampled at the desired conversion rate. As in the SPSC shown in FIG. 1, DAC 210 may output an analog representation of input signal 201. However, the output signal 203 of DAC 210 may differ from the original input signal 201 in numerous ways.

One difference between signals 201 and 203 may result from quantization errors that may be introduced by ADC 208. Output signal 203 may also be delayed with respect to input signal 201. In addition, the sampling process may create high frequency mirrors of the analog input 201 around integer multiples of the sampling frequency, while the amplitude of output signal 203 may be attenuated at high frequencies if DAC 210 is implemented with a zero order hold output. In one set of embodiments, the high frequency attenuation may follow a functional pattern representative of the gain of a traditional DAC. The gain of a traditional time-continuous DAC (with a zero order hold network) as a function of frequency may be expressed by the equation:

$$H(frequency) = \frac{\sin\left(\pi * \frac{frequency}{samplerate}\right)}{\left(\pi * \frac{frequency}{samplerate}\right)}, \quad (1)$$

where frequency refers to the frequency of the DAC input signal, and samplerate refers to the sample rate at which the DAC is operated.

It should be noted that the difference between signals 201 and 203 resulting from quantization errors may be intentional, and similar in nature as present in an SPSC. However, the other differences (as listed above) between input signal 201 and DAC output signal 203 may, however, be considered undesirable, as they may result in a residue so large that the next stage in the pipeline might saturate. These other differences may be attributed in large part to the absence of the track and hold component (e.g. 102 and 110, as shown in FIG. 1), and would therefore not be present in an SPSC, such as the one shown in FIG. 1. Therefore, in one set of embodiments, these other differences may be addressed in pipeline stage 200 by the presence of delay block 202, Low-Pass (LP) filter 204, and anti alias filter 214. These components will now be described in more detail.

Delay block: Delay block 202 may be configured to delay input signal 201 in order for signals 203 and 205 entering difference block 212 before anti alias filter 214 to be delayed equally. By having signals 203 and 205 entering difference block 212 with minimal or no delay with respect to each other, the amplitude of the difference between signals 203 and 205 may effectively be minimized. In one set of embodiments, delay block 202 may be implemented as either a high order passive low pass filter or as a delay line in form of a cable, or a delay line on a printed circuit board (PCB). Those skilled in the art will appreciate that other implementations for delay block 202 are possible and alternate embodiments may feature implementations other than mentioned herein.

LP (low pass) filter: LP filter 204 may be configured to attenuate higher frequencies commensurately with the attenuation that may take place in DAC 210. In one embodiment, the signal attenuation may follow the pattern shown in equation (1). In cases where LP filter 204 is not (or cannot be) configured to match the frequency dependent amplitude attenuation following the function of equation (1) at high frequencies, DAC 210 may be configured to perform over sampling.

Anti alias filter: Anti alias filter 204 may be configured to remove high frequency noise components originating from the quantization performed by ADC 208, as well as to remove high frequency mirrors of input signal 201 on the output of DAC 210. In addition, bandwidth limitation introduced through anti alias filter 204 may result in the reduction of high frequency broadband noise that may be characteristic of the operation of DAC 210.

As in an SPSC, the digital output of the time continuous converter may be calculated by combining the digital outputs of the various sections (one example of the digital output of a single section is shown as digital output 217 in FIG. 2). For example, the output signal of LP filter 204 may be calculated as the sum of the signal on the input of the anti alias filter and the output 203 of the DAC. The input of anti alias filter 214 may be calculated from its quantized (residue) output 215 by an emulation of the inverse transfer function of anti alias filter 214. In one set of embodiments this may be achieved by convolving the quantized residue output 215 with an impulse signal having a frequency content similar to the inverse transfer function of anti alias filter 214 in the frequency band of interest. Finally, the output of DAC 203 may be accurately calculated by a multiplication of the digital output of ADC 208 with the gain of DAC 210.

It should also be noted here that even better accuracy may be achieved by accurately modeling the non-linear transfer function of DAC 210. One example of accurate modeling that may be performed is similar to the correction performed in flexible resolution converters as described in U.S. Pat. No. 6,020,838. Input signal 201 may be calculated by convolving the output of LP filter 204 with an impulse signal having a frequency content similar to the inverse transfer function of LP filter 204 in the frequency band of interest. If over sampling is used, the digital representation of the input signal may be decimated.

In general, converter stage 200 may be operated to obtain an accurate digital representation of time continuous input signal (e.g. a voltage signal) 210 applied to the input of converter stage 200. The output 205 of LP filter 204, the output 203 of DAC 210, and the output of difference element 212 may be categorized as "internal" (i.e. unknown) signals. Assuming that the digital output 217 of ADC 208 is known, that the transfer function of DAC 210 is known, that the filter function of anti alias filter 214 is known, and that residue output 215 may be accurately converted—and hence known, input signal 210 may be calculated by first calculating the output 205 of LP filter 204 based on the known signals. Since the output of difference element 212 is indeed the difference between output signal 205 of LP filter 204 and output signal 203 of DAC 210, signal 205 may be calculated as the sum of signal 203 and the output of difference element 212. Since signal 203 is the output of DAC 210, it may be calculated digitally from a known transfer function of DAC 210 and the known digital output 217 of ADC 208. The output of difference element 212 may be calculated from residue output 215 using the inverse transfer function of anti alias filter 214. When output 205 of LP filter 204 is known, time-continuous input signal 201 may be calculated using the inverse filter function of LP filter 204. In one set of embodiments, the filter functions and the DAC transfer function may be obtained by implementing self-calibration algorithms.

Figure 3:
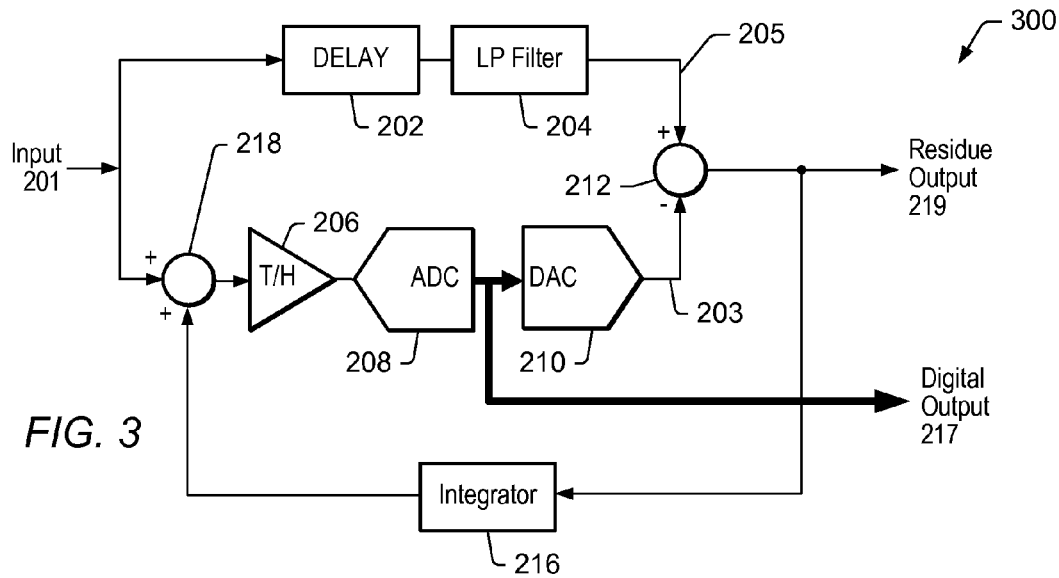
FIG. 3 shows a single stage of a time-continuous implementation equivalent to a single conversion stage in an SPSC, with an integrator feedback path according to one embodiment of the present invention While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

The time-continuous pipeline converter stage 200 shown in FIG. 2 may further be modified to implement possible additional improvements. One alternate embodiment is shown as time-continuous stage 300 in FIG. 3, in which an integrator 216 has been inserted into a feedback loop formed between residue output 219 and a summation element 218, to effectively remove the DC (direct current) component(s) of residue output 219. In other words, residue output 219 may be fed back to ADC 208 through integrator 216 and summation node 218, where the integrated version of residue output 219 may be added to time-continuous input signal 201, to attenuate the DC and low frequency contents of residue output 219. Element (node) 218 may be configured as a summation node since an inversion already exists within the integrator loop, from difference node 212. This may allow a subsequent stage (e.g. the second stage) in the pipeline to be AC—(alternating current) coupled. While anti alias filter 214 is omitted from the embodiment shown in FIG. 3, alternate embodiments may include anti alias filter 214, coupling residue output 215 to difference element 218 via integrator 216.

The time-continuous version of an SPSC as described herein (including single stage 200) may be implemented in a variety of ways. Since the dynamic range requirement for the second stage is less stringent than for the first stage, there is greater freedom in how the second stage may be implemented. For example, one economical and high performance implementation may be accomplished with the first stage operating in time continuous mode, while the subsequent stages could be implemented using a standard SPSC architecture.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

We claim:

1. A converter comprising:
   an analog input port configured to receive a primary analog input signal;
   a digital output port configured to provide a primary digital output signal representative of the primary analog input signal; and
   a plurality of converter stages coupled in a pipeline, wherein a primary input of the pipeline is coupled to the analog input port;
   wherein each of at least a subset of the plurality of converter stages is operable to:
      receive a time-continuous respective analog input signal;
      generate a respective digital output signal based on the received time-continuous respective analog input signal;
      generate an analog version of the respective digital output signal;
      generate a respective residue output by combining the received time-continuous respective analog input signal and the analog version of the respective digital output signal; and
      provide the respective residue output as an analog input signal of a next one of the plurality of converter stages in the pipeline;
   wherein the converter is operable to generate the primary digital output signal by combining the respective digital output signals of the plurality of converter stages.

2. The converter of claim 1, wherein said combining the received time-continuous respective analog input signal and the analog version of the respective digital output signal comprises:
   subtracting the received time-continuous respective analog input signal from the analog version of the respective digital output signal; or
   subtracting the analog version of the respective digital output signal from the received time-continuous respective analog input signal.

3. The converter of claim 1, wherein the subset of the plurality of converter stages comprises an input stage operable to receive the primary analog input signal as its time-continuous respective analog input signal.

4. The converter of claim 1, wherein each of one or more of the at least a subset of the plurality of converter stages is operable to delay its time-continuous respective analog input signal to compensate for a time delay between the analog version of its respective digital output signal and its time-continuous respective analog input signal.

5. The converter of claim 1, wherein each of one or more of the at least a subset of the plurality of converter stages is operable to attenuate its time-continuous respective analog input signal according to a specified functional pattern based on a frequency of its time-continuous respective analog input signal and a sample frequency used in generating the analog version of its respective digital output signal.

6. The converter of claim 5, wherein the specified functional pattern is represented by Sin(X)/X, wherein X represents $\pi * f/f_s$, wherein f represents the frequency of the time-continuous respective analog input signal, and wherein $f_s$ represents the sample frequency used in generating the analog version of the respective digital output signal.

7. A converter stage adapted to fit into a sampled pipeline subranging converter, the converter stage comprising:
   an input configured to receive a time-continuous analog input signal;
   a first converter element coupled to the input and operable to generate a digital output signal representative of the time-continuous analog input signal;
   a second converter element having an output, and configured to receive the digital output signal and to generate and provide at its output an analog output signal representative of the digital output signal; and
   a difference element having:
      a first input configured to receive a first time-continuous analog signal based on the time-continuous analog input signal;
      a second input coupled to the output of the second converter element; and
      an output configured to couple to the input of another converter stage;
   wherein the difference element is operable to generate and provide at its output a difference signal obtained from the first time-continuous analog signal and the analog output signal.

8. The converter stage of claim 7, further comprising a delay element coupled between the input of the converter stage and the first input of the difference element.

9. The converter stage of claim 8, wherein the delay element is operable to delay the time-continuous analog input signal to minimize or eliminate a delay between the time-continuous analog input signal and the analog output signal.

10. The converter stage of claim 8, wherein the delay element is one of:
    a high order, passive low-pass filter;
    a cable; or
    a delay line on a printed circuit board.

11. The converter stage of claim 7, further comprising a low-pass (LP) filter coupled between the input of the converter stage and the first input of the difference element to generate the first time-continuous analog signal.

12. The converter stage of claim 7, further comprising a filter coupled between the input of the converter stage and the first input of the difference element, and configured to attenuate the time-continuous analog input signal according to a specified functional pattern to generate the first time-continuous analog signal.

13. The converter of claim 12, wherein the specified functional pattern corresponds to an attenuation pattern characteristic of the second converter element.

14. The converter of claim 12, wherein the specified functional pattern follows sin(X)/X, wherein X represents $\pi*f/f_s$, wherein f represents a frequency of the time-continuous analog input signal, and wherein $f_s$ represents a sample frequency used by the second converter element in generating the analog output signal.

15. The converter of claim 7, further comprising an anti alias filter having an input coupled to the output of the difference element and further having an output configured to couple to the input of another converter stage.

16. The converter of claim 15, wherein the anti alias filter is configured to perform one or more of:
  remove high frequency noise components originating from operation of the first converter element;
  remove high frequency mirrors of the analog output signal; or
  reduce high frequency broadband noise originating from operation of the second converter element.

17. A method for converting an input signal, the method comprising:
  (a) receiving a time-continuous analog signal;
  (b) generating a digital signal based on the received time-continuous analog signal;
  (c) generating a first time-continuous analog signal based on the received time-continuous analog signal;
  (d) generating an analog output signal based on the digital output signal;
  (e) generating a difference signal of the first time-continuous analog signal and the analog output signal;
  performing (a) through (e) a plurality of times;
    wherein a first time (a) is performed, (a) comprises receiving the input signal;
    wherein after (a) was performed the first time, for each performing of (a), (a) comprises receiving a difference signal generated during a most recent previous performing of (e); and
  generating an output signal based on at least a subset of all digital output signals generated during said performing (a) through (e) a plurality of times.

18. The method of claim 17, wherein said generating the first time-continuous analog signal comprises delaying the received time-continuous analog signal.

19. The method of claim 18, wherein said delaying the received time-continuous analog signal comprises delaying the received time-continuous analog signal by an amount that minimizes or eliminates a delay between the first time-continuous analog signal and the analog output signal.

20. The method of claim 17, wherein said generating the first time-continuous analog signal comprises attenuating the received time-continuous analog signal according to a specified functional pattern.

21. The method of claim 20, wherein the specified functional pattern comprises a sin(X)/X function, wherein X represents $\pi*f/f_s$, wherein f represents a frequency of the time-continuous analog signal, and wherein $f_s$ represents a sample frequency used in said generating the analog output signal.

22. The method of claim 17, further comprising one or more of:
  removing high frequency noise components generated during (b);
  removing high frequency mirrors of the analog output signal;
  reducing high frequency broadband noise generated during (d); or
  removing DC (direct current) contents of the difference signal.

23. A time continuous subranging analog-to-digital converter, the converter comprising:
  a main input configured to receive a time-continuous first analog input signal;
  a first stage comprising:
    a delay element having an input coupled to the main input and operable to delay the time-continuous first analog input signal;
    a low-pass filter configured to receive the delayed time-continuous first analog input signal and filter the delayed time-continuous first analog input signal;
    a sub-analog-to-digital-converter (SADC) having an input coupled to the main input and operable to generate a first digital signal representative of the time-continuous first analog input signal;
    a sub-digital-to-analog-converter (SDAC) configured to receive the first digital signal and generate a first analog output signal representative of the first digital signal; and
    a first difference element configured to generate a first difference signal from the filtered delayed time-continuous first analog input signal and the first analog output signal;
  one or more additional stages coupled in a pipeline, wherein each of the one or more additional stages is operable to:
    receive a respective analog input signal;
    generate a respective digital signal representative of the respective analog input signal;
    generate a respective analog output signal representative of the respective digital signal; and
    generate a respective difference signal based on the respective analog input signal and the respective analog output signal, wherein a first stage of the one or more additional stages is configured to receive the first difference signal as its respective analog input signal, and each other stage of the one or more additional stages is operable to receive as its respective analog input signal the difference signal from a previous stage of the one or more additional stages in the pipeline; and
  circuitry configured to generate a digital output signal representative of the time-continuous analog input signal, by combining the first digital signal and the respective digital signals generated by the one or more additional stages in the pipeline.

24. The converter of claim 23, wherein the first stage further comprises an integrator having an input configured to receive the first difference signal, and operable to remove DC (direct current) contents of the first difference signal.

25. The converter of claim 24, wherein the first stage further comprises a first summation element having:
  a first input coupled to the main input;
  a second input configured to receive an output signal of the integrator; and
  an output coupled to the input of the SADC.

26. The converter of claim 25, wherein the first stage further comprises a track-and-hold element having an input coupled to the output of the second difference element, and an output coupled to the input of the SADC.

* * * * *